United States Patent [19]

Evans et al.

[11] Patent Number: 4,655,519

[45] Date of Patent: Apr. 7, 1987

[54] ELECTRICAL CONNECTOR FOR INTERCONNECTING ARRAYS OF CONDUCTIVE AREAS

[75] Inventors: William R. Evans, Clemons, N.C.; David B. Sinisi, Harrisburg, Pa.

[73] Assignee: AMP Incorporated, Harrisburg, Pa.

[21] Appl. No.: 787,855

[22] Filed: Oct. 16, 1985

[51] Int. Cl.⁴ .............................................. H01R 9/09
[52] U.S. Cl. .................... 339/17 CF; 339/222
[58] Field of Search .......... 339/17 CF, 17 M, 17 LM, 339/17 F, 176 MF, 176 MP, 222

[56] References Cited

U.S. PATENT DOCUMENTS

| | | | |
|---|---|---|---|
| 4,008,938 | 2/1977 | Anhalt et al. | 339/17 LM |
| 4,199,209 | 4/1980 | Cherian et al. | 339/17 M |
| 4,354,729 | 10/1982 | Grabbe et al. | 339/17 CF |
| 4,422,709 | 12/1983 | Croci et al. | 339/176 MF |
| 4,437,718 | 3/1984 | Selinko | 339/17 CF |
| 4,504,887 | 3/1985 | Bakermans et al. | 339/17 CF |

OTHER PUBLICATIONS

IBM Bulletin, Dunman, vol. 7, No. 3, p. 182, 8-1964.

Primary Examiner—Neil Abrams
Attorney, Agent, or Firm—Allan B. Osborne

[57] ABSTRACT

An electrical connector for positioning between and electrically interconnecting electrical components. The electrical connector includes a dielectric housing having compartments and contact elements freely disposed in the compartments and having cantilever spring arms supporting conductive contact areas at the free ends thereof for electrical engagement with conductive pads or the like on the electrical components.

19 Claims, 10 Drawing Figures

ELECTRICAL CONNECTOR FOR INTERCONNECTING ARRAYS OF CONDUCTIVE AREAS

FIELD OF THE INVENTION

The invention disclosed herein is in the field of electrical connectors providing electrical interconnections between electrical components such as circuit boards and leadless electronic packages.

BACKGROUND OF THE INVENTION

Electrical connectors such as disclosed in U.S. Pat. No. 4,505,529 include a dielectric housing with a plurality of contact elements therein providing electrical interconnections between conductive pads on electrical components such as a printed circuit board and a leadless active device substrate. The contact elements include parallel contact surfaces at each end for surface engagement with conductive pads on the electrical components and three circumferentially spaced elongated beams attached to and extending between the contact surfaces. The beams buckle under compression to provide spring forces to maintain abutting electrical engagement between the contact surfaces and the respective conductive pads. While this type connector has use in low speed applications, the electrical path along the elongated beams extending between the contact surfaces is too long for high speed applications. Further, where the contact element has a dual function; i.e., providing the spring force as well as the electrical path, design parameters of each function sometimes conflict. Accordingly, trade-offs are made which result in some sacrificed advantages otherwise available.

SUMMARY OF THE INVENTION

According to the present invention, an electrical connector is disclosed which has high speed applications and into which desired electrical parameters can be designed without affecting the desired spring force characteristics. The electrical connector includes a dielectric housing having compartments therein with openings thereto in each of two opposing surfaces. Contact elements, disposed in the compartments, include diverging contilever spring arms extending to respective openings at the opposing surfaces. Contact areas are supported on the free ends of the cantilever spring arms for electrical engagement with conductive pads on the electrical components adjacent to the openings.

BRIEF DESCRIPTION OF THE DRAWINGS

FIG. 4-B is a perspective view showing the spring members of FIG. 4-A subsequent to being formed;

DETAILED DESCRIPTION OF THE INVENTION

Figure 1:
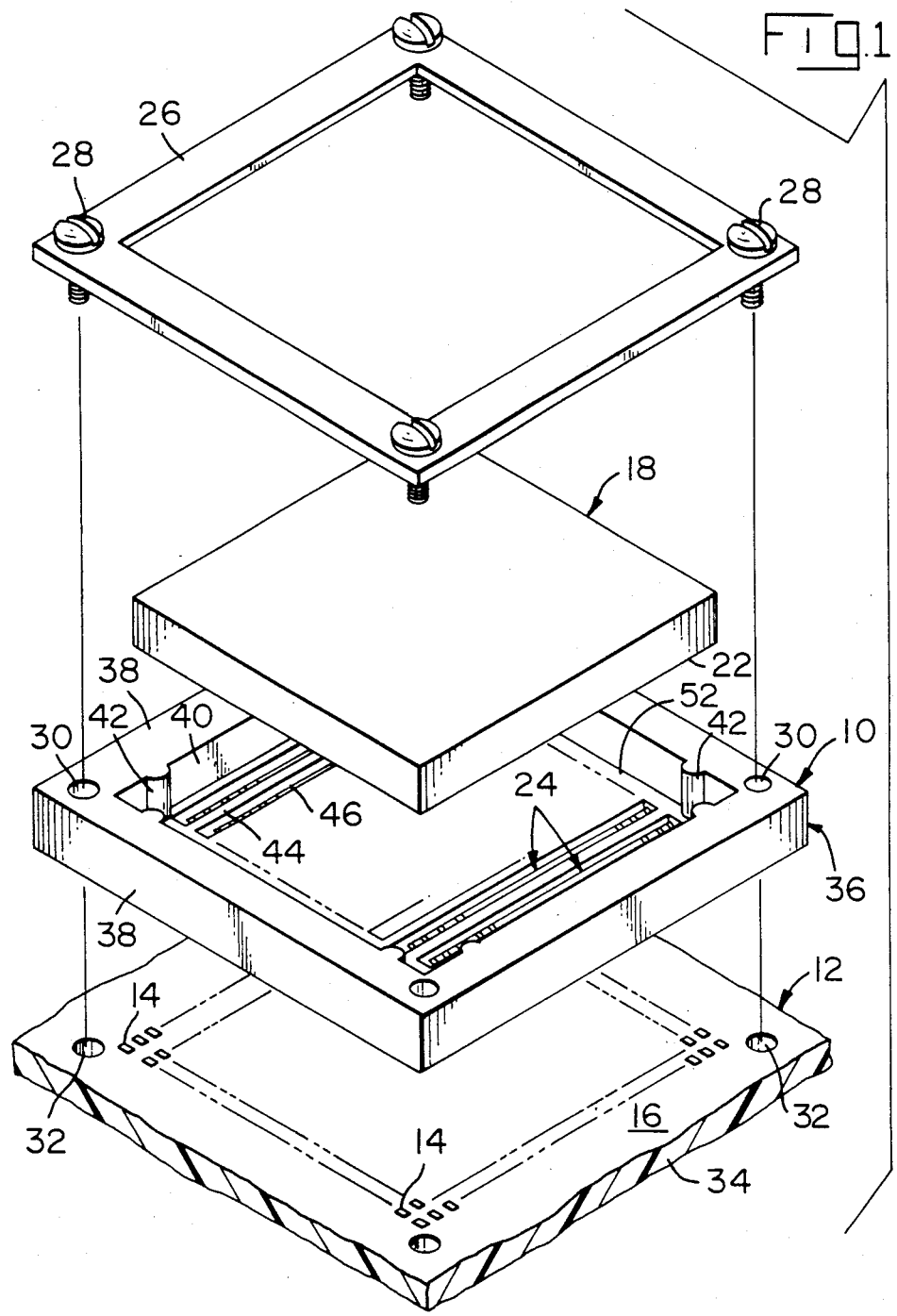
FIG. 1 is an exploded, perspective view showing generally an electrical connector of the present invention, a circuit board, an electronic pad array package and a clamping frame.

FIG. 1 shows electrical connector 10 of the present invention along with circuit board 12 having a plurality of conductive pads 14 on surface 16 and an electronic pad array package 18 such as a leadless chip carrier with conductive pads 20 (FIG. 7) on under surface 22. As shown in FIG. 8, pads 20 are electrically connected to pads 14 via contact elements 24 in connector 10. Thus, pads 14 are in alignment with respective pads 20 and are electrically connected together via contact elements 24 of connector 10.

FIG. 1 also shows clamping frame 26 which clamps connector 10, circuit board 12 and pad array package 18 together by means of screws 28 being received in holes 30, 32 in connector 10, board 12 respectively and secured on undersurface 34 of board 12 with nuts (not shown). Other fastening means could be used as well. Although not shown, a heat sink could be mounted on pad array package 18 and held in place with little or no structural change to frame 26.

Circuit board 12 and pad array package 18 are shown for illustrational purposes only. Any electrical component having an array of surface exposed conductive means would be suitable for use with the electrical connector 10 of the present invention.

Electrical connector 10 includes housing 36 which is preferably molded from a suitable dielectric material such as a polysulfone sold by the Union Carbide Company under the trademark MINDEL.

As shown in FIG. 1, side walls 38 of housing 36 extend upwardly, and in cooperation with surface 52, define a pad array package receiving cavity 40. Arcuate bosses 42 on the inside surfaces of side walls 38 center pad array package 18 in cavity 40.

Figure 2:
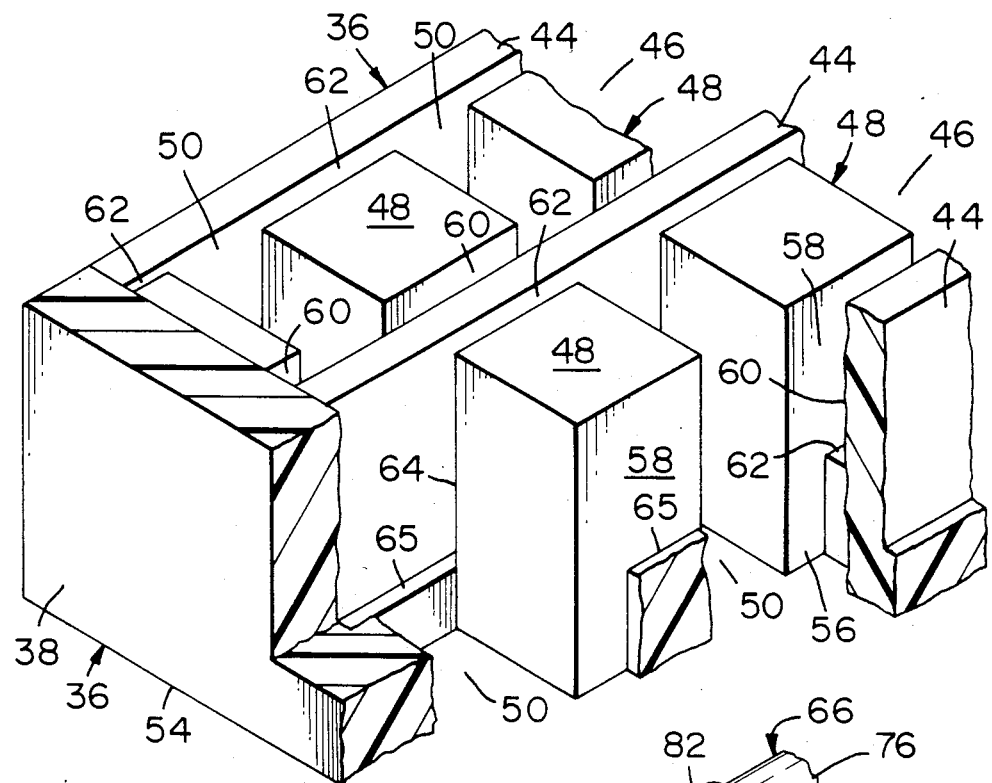
FIG. 2 is a perspective, partly sectioned view of a portion of the dielectric housing the connector.

As shown in FIG. 2, spaced apart, parallel interior walls 44 define contact strip receiving rows 46 in housing 36. A plurality of spaced apart blocks 48 are located in each row 46, defining therebetween L-shaped compartments 50 which extend between adjacent interior walls 44 and are opened from surface 52 through opposing surface 54 of housing 36. Short legs 56 of L-shaped compartments 50 are located between surfaces 58 of blocks 48 and the adjacent interior wall 44. Slots 60, 62 are provided between opposing surfaces 58, 64 respectively of blocks 48 and the interior walls 44 immediately adjacent thereto. As shown, slots 60, 62 extend into side walls 38. Slots 60, 62 further define upwardly facing slot floors 65.

Figure 3:
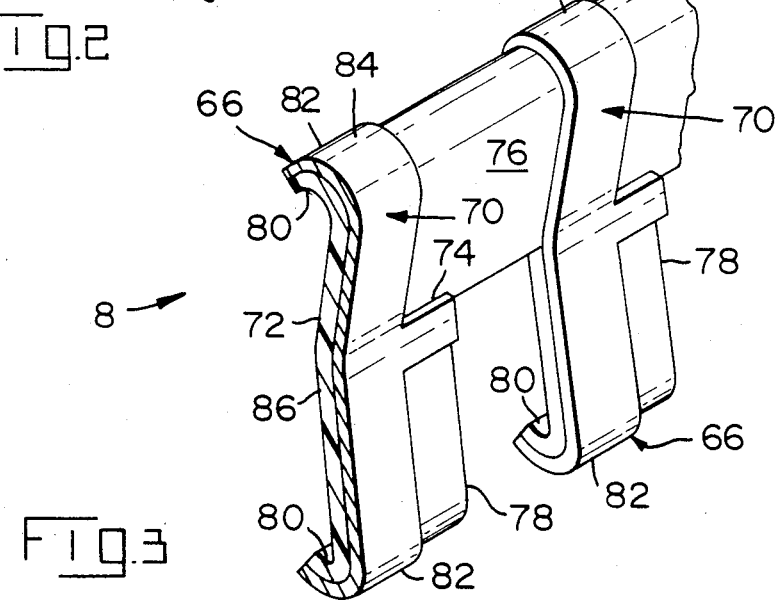
FIG. 3 is a perspective, partly sectioned view of a strip of conductive members.
Figure 4A:
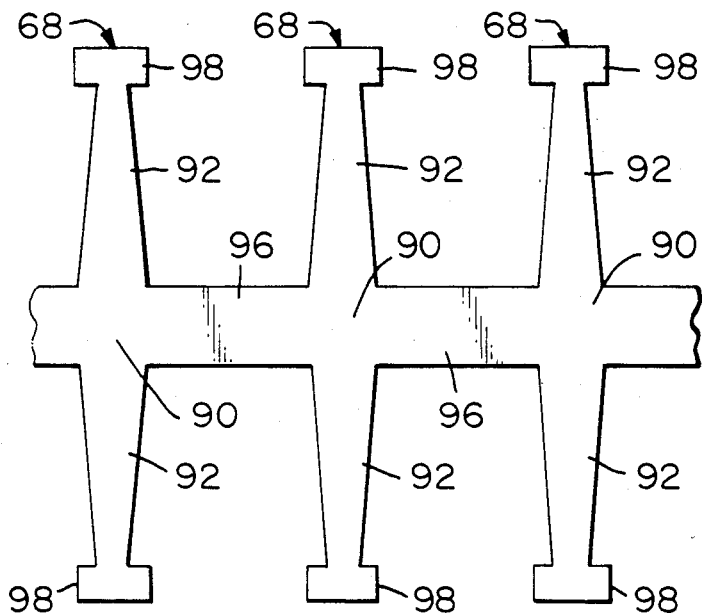
FIG. 4-A is a plan view showing a strip of blanked out spring members.
Figure 4B:
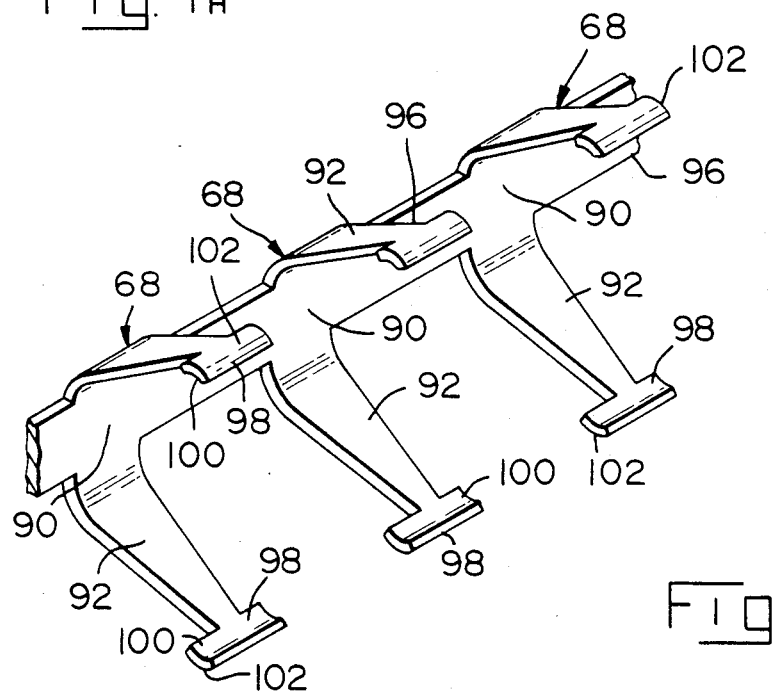

The aforementioned contact elements 24 are assembled from conductive members 66, shown in FIG. 3, and spring members 68 shown in FIGS. 4-A, 4-B.

With reference to FIG. 3, a short strip of two conductive members 66 are shown. A single member 66 is a laminate of conductive trace 70 bonded to dielectric substrate or film 72. Suitable materials include dead soft copper for trace 70 and a flexible film for substrate 72 such as a polyimide sold by the DuPont Company under the trademark KAPTON. An adhesive, also sold by the DuPont Company under the trademark PYRALUX is used to bond trace 70 to substrate 72. A short ear 74, part of trace 70 and projecting laterally therefrom, provides additional bonding area between trace 70 and substrate 72.

Preferably, conductive members 66 are made by a continuous strip process with substrate 72 between adjacent traces 70 providing connecting straps 76, the lower portion of which is removed to define cut-outs 78.

Opposing sides of conductive members 66 are formed into a concavo-convex shape with concave surfaces 80 being on the inside and convex surfaces 82 facing outwardly. The apexes of convex surfaces 82 of conductive traces 80 provide contact areas 84. The dead soft copper of traces 70 maintain the concavo-convex shape which, as shown, extends along the connecting strap portions 76 of substrate 72 as well.

Further, members 66 are predisposed to buckle inwardly by being bent in slightly with bend line 86 being intermediate the concavo-convex sides and parallel thereto.

Subsequent to bonding and forming, contact areas 84 are selectively plated with a gold flash over nickel.

Spring members 68, as shown in FIGS. 4-A, 4B are preferably stamped and formed in a continuous strip with beryllium copper or stainless steel being a suitable material. FIG. 4-A shows a short strip of three spring members 68 after being blanked out but prior to forming. Each member 68 includes a center support 90 and diverging cantilever spring arms 92 extending outwardly from opposing edges thereof. The intervening length of material between adjacent spring members 68 provides connecting strap 96.

Arms 92 narrow in width from support 90 outwardly to transverse bars 98 located at the free ends thereof.

FIG. 4-B shows three spring members 68 after being formed. Cantilever spring arms 92 are folded in towards each other on the same side of center support 90 to define a C-shape. Transverse bars 98 are curved along their longitudinal axis into a concavo-convex shape with concave surfaces 100 facing inwardly and convex surfaces 102 facing outwardly.

Spring members 68 made of beryllium copper are plated with tin or nickel to prevent corrosion.

Figure 5:
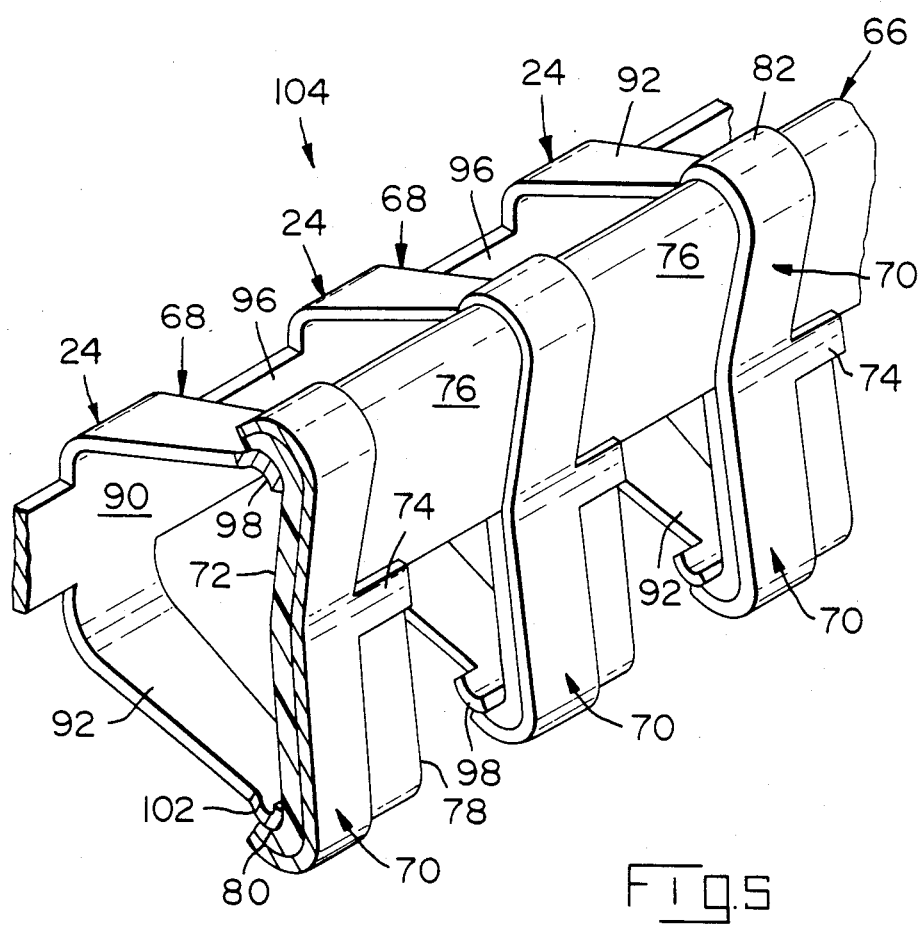
FIG. 5 is a perspective, partly sectioned view showing a strip of contact elements assembled from the conductive and spring members of FIGS. 3 and 4-A, 4-B.

As noted above, contact elements 24 are assembled by joining the strip of conductive members 66 and spring members 68. FIG. 5 shows a short contact strip 104 of three contact elements 24. In assembling elements 24, the concavo-convex sides of conductive members 66 are placed over the concavo-convex shaped transverse bars 98 of spring members 68. Concave surfaces 80 of conductive members 66 are secured to convex surfaces 102 of bars 98 by the use of a suitable adhesive such as the aforementioned PYRALUX adhesive. As can be discerned, concave surfaces 80 constitute substrate 72 thereby isolating conductive traces 70 from respective spring members 68.

Figure 6:
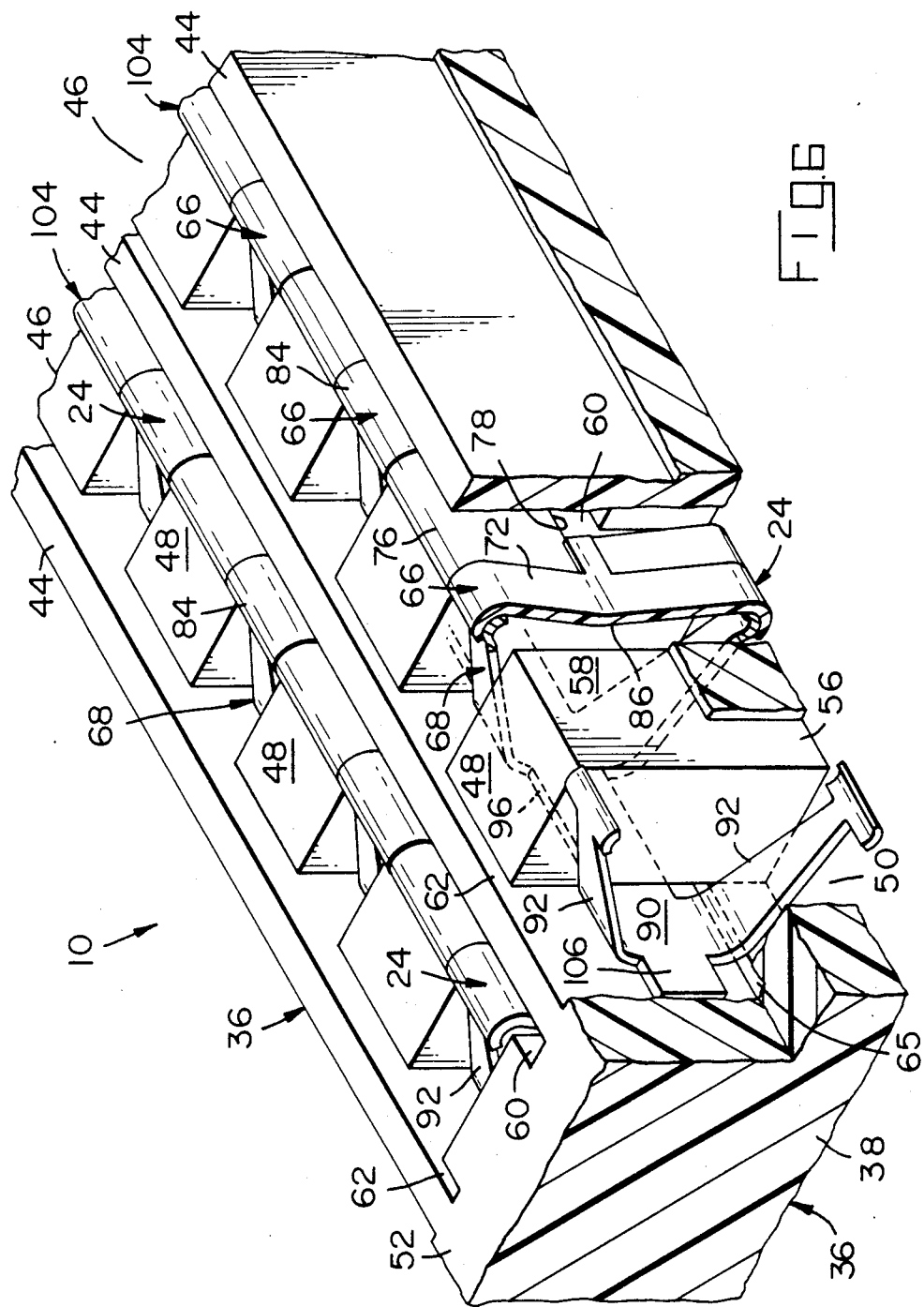
FIG. 6 is a perspective, partly sectioned view showing a portion of the connector housing with contact elements, formed by joining the spring and conductive members, loaded thereinto.

FIG. 6 is a perspective, partly sectioned view showing contact strips 104 inserted into rows 46 to form electrical connector 10. Each contact element 24 occupies a compartment 50 with center support 90 adjacent one interior wall 44, spring arms 92 extending across compartment 50 and conductive member 66 adjacent the opposing interior wall 44. Each 74 extends into short leg 56 of L-shaped compartment 50. Connecting straps 96 on spring members 68 are received in slots 62 and connecting straps 76 between conductive members 66 are received in slots 60. The portions of housing 36 extending between interior walls 44 and surfaces 58 on blocks 48 receive cut-outs 78 between conductive members 66.

Other than perhaps a very slight interference from connecting straps 96 entering slots 62, contact strips 104 are freely received in rows 46. Strips 104 are retained in housing 36 via straps 76, 96 being disposed in respective slots 60, 62 and engaing floors 65 of slots 60, 62.

In cutting the required length of contact strips 104, a short stub 106 of connecting strap 96 as shown in FIG. 6 is left at each end of strips 104 to be received in slots 62 in side walls 38. Similar stubs (not shown) of substrates 72 are left to be received in slots 60 in side walls 38. Thus, straps 96 and stubs 106 of spring members 68 are disposed in slots 62 while straps 76 and the end stubs of dielectric substrate 72 are disposed in slots 60 of housing 36. This arrangement enables strips 104 to move freely relative to housing 36. The edges of spring arms 92 adjacent straps 96 and the edges of cut-outs 78 of straps 76 and the exposed sections of bars 98 of spring arms 92 relative to compartments 50 automatically center contact elements 24 in respective compartments 50.

Figure 7:
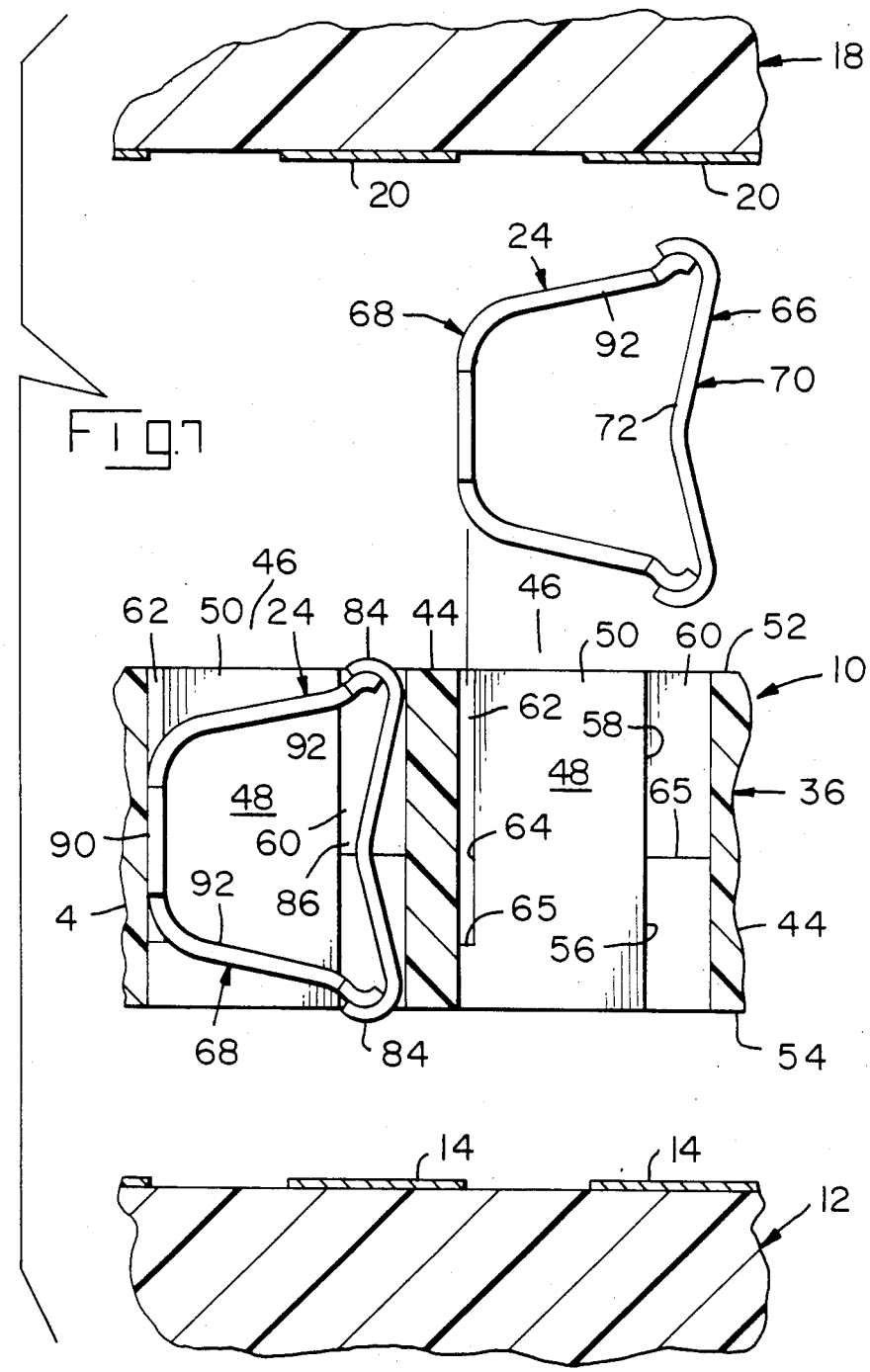
FIG. 7 is an exploded, sectioned, side elevation view illustrating the positioning of the contact elements in the housing and conductive pads on two electrical components.
Figure 8:
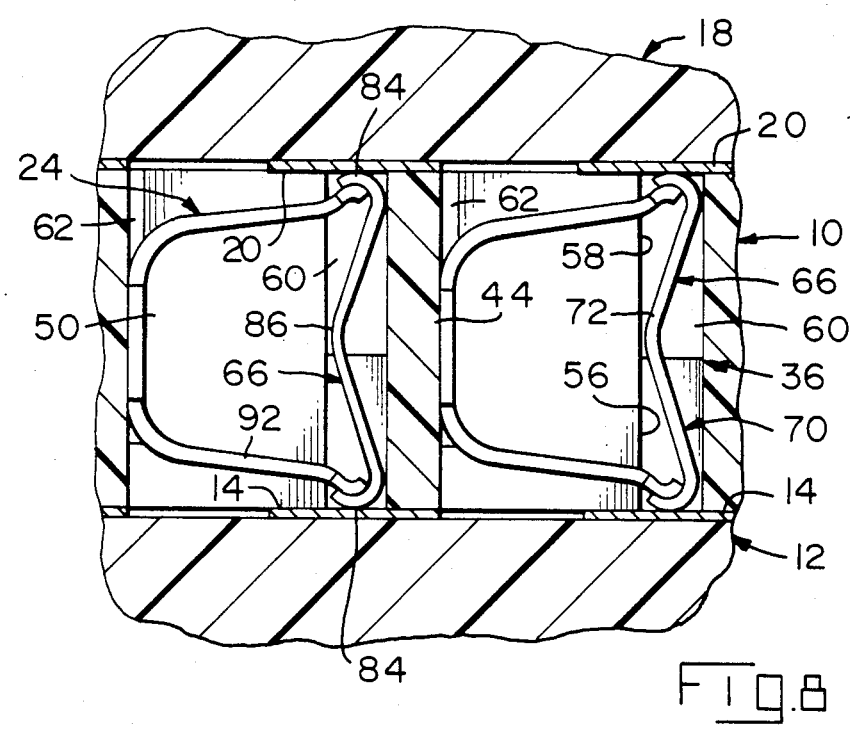
FIG. 8 is a sectioned, side elevation view of the connector positioned between and electrically interconnecting the two electrical components.

FIG. 7 is a side sectional view showing electrical connector 10 between circuit board 12 and pad array package 18 prior to interconnecting pads 14 and 20 of board 12 and package 18. One contact element 24 is shown in compartment 50 in one row 46 and another contact element 24 is shown exploded out from compartment 50 in an adjacent row 46. This side view shows clearly slots 60, 62 defined by interior walls 44 and blocks 48. Further, with respect to the contact element 24 positioned in a compartment 50, the drawing shows the positioning of contact areas 84 and bend line 86 relative to spring arms 92 and housing 36. As shown, spring arms 92 are initially formed so that with contact element 24 centered, contact areas 84 extend beyond respective surface 52 and opposing surface 54.

FIG. 8 is a side sectional view, similar to FIG. 7, showing connector 10 positioned between circuit board 12 and pad array package 18 in cavity 40 with frame 26 (not shown in FIG. 8) clamping the three together. Circuits (not shown) on board 12 and package 18 are electrically connected through contact elements 24 with contact areas 84 thereon engaging respective conductive pads 14, 20 on board 12, package 18 respectively. Contact elements 24 are freely movable and automatically centered within compartments 50 and spring arms 92 are resiliently deflected towards each other, applying a normal contact engaging force by the contact areas 84 onto conductive pads 14, 20. As a result of the reduction in distance between spring arms 92 when contact elements are connected to conductive pads 14, 20, conductive members 66 are buckled inwardly along bend line 86.

Figure 9:
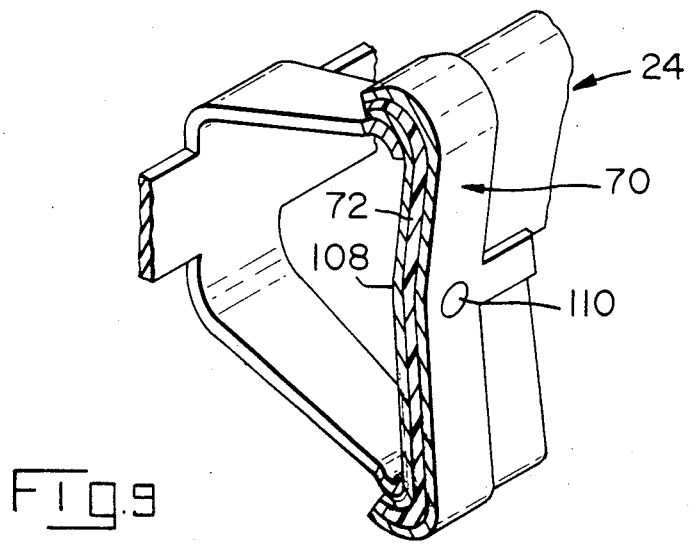
FIG. 9 is a perspective, partly sectioned view of a contact element with a ground plane.

FIG. 9 shows a contact element 24 with ground plane 108 bonded to the inside surface of substrate 72; i.e., the surface opposite the surface on which conductive traces 70 are bonded. Means 110; e.g., a rivet, electrically connects plane 108 to a selected trace or traces 70. Conductive pads 14, 20 between which trace 70 is connected to ground plane 108 is connected to ground circuits (not shown).

Because of the aforementioned automatic centering of contact elements 24 in compartments 50, contact areas 84 will be able to engage conductive pads 20, 22 regardless of any out-of-tolerance conditions. Thus, the electrical integrity of the interconnection is insured.

Inserting a single contact strip 104 in each row 46 is preferred. However, single contact elements 24 can also be inserted with each such element 24 including on each side of spring member 68 short stub 106 which would be received in slots 62. Similar short stubs (not shown) would also be left on each side of conductive member 66 for disposition in slots 60. An advantage of employing elongated contact strips 104 however is, besides ease in loading housing 36, that a single ground plane 108 for each row 46 can be incorporated into connector 10.

An important advantage of the present invention is being able to tailor the width and thickness of conductive trace 70 and the thickness of substrate 72 to provide desired impedance characteristics without interfering with the normal force designed into spring members 68. Another important feature is the fact that when contact areas 84 are engaged with conductive pads 14, 20, wiping action therebetween takes place. A further important feature is that the path between conductive pads 14, 20 via respective traces 70 is short thereby rendering the present invention readily applicable to high speed signal processing. An additional feature is that the spacing between contact elements is very small for high density interconnections between closely spaced conductive areas of electronic components. Yet another important feature of the present invention is that each cantilever spring arm 92 acts independently and can adjust to accomodate out-of-tolerance situations.

We claim:

1. An electrical connector for being positioned between and electrically interconnecting electrical components of the type having conductive means on surfaces thereof, comprising:
   dielectric housing means having one or more rows of compartments therein with opening thereto in each of two opposing surfaces, said compartments in a given row being interconnected by slot means;
   spring means disposed in said compartments with said spring means in a given row being connected by strap means received in said slots means, said spring means having diverging cantilever spring arms extending to the respective openings; and
   conductive element means, having conductive contact means thereon, connected to and extending between said spring arms for electrically interconnecting said electrical components.

2. The electrical connector of claim 1 wherein said conductive element means includes a conductive material bonded to a flexible dielectric substrate attached to and extending between said spring arms.

3. The electrical connector of claim 2 wherein the conductive material includes a dead soft copper and the flexible substrate defines a dielectric film.

4. The electrical connector of claim 2 wherein said cantilever spring arms include free ends having a convex surface to which said flexible substrate is attached.

5. The electrical connector of claim 4 wherein said conductive element means include a conductive trace bonded to a dielectric substrate and said dielectric substrate is attached to and extends between said spring arms.

6. The electrical connector of claim 5 wherein said spring means are formed from a conductive material.

7. The electrical connector of claim 6 further including ground plane means on one of said spring means in said given row and which is electrically connected to said conductive trace on said spring arms on one of said spring means.

8. An electrical connector for being positioned between and electrically interconnecting electrical components of the type having conductive means on surfaces thereof, comprising:
   dielectric housing means having a plurality of compartments therein with openings thereto in each of two opposing surfaces, said compartments being arranged in one or more rows with said compartments in each row being connected by a first slot extending therebetween; and
   a plurality of contact element means disposed in said compartments and comprising spring members with said spring members in each row being connected by strap means received in said first lot, and having diverging cantilever spring means extending to respective openings and conductive members attached to and extending between said diverging cantilever spring means and having conductive contact means thereon positioned adjacent respective openings for electrically engaging and interconnecting conductive means on electrical components adjacent respective openings.

9. The electrical connector of claim 8 further including a second slot in said housing means connecting said compartments in each row, said second slot being spaced from said first slot.

10. The electrical connector of claim 9 wherein said conductive members in each row are connected by strap member means with said strap member means being received in said second slot.

11. The electrical connector of claim 10 wherein said cantilever spring means include diverging cantilever spring arms with free ends thereon providing convex surfaces facing respective openings.

12. The electrical connector of claim 11 wherein said spring arms extend across said compartment from said first slot toward said second slot.

13. The electrical connector of claim 12 wherein said conductive members include a trace of a conductive material bonded to a substrate of a dielectric material.

14. The electrical connector of claim 13 wherein said conductive material includes a dead soft copper and said dielectric material defines a flexible film.

15. The electrical connector of claim 14 wherein said conductive members have concavo-convex sides with said concave side being bonded to said convex surfaces on said free ends of said spring arms.

16. The electrical connector of claim 15 wherein said conductive members are predisposed to buckle in as said diverging cantilever spring arms are compressed towards each other.

17. A contact element for positioning in a dielectric housing means having contact element receiving compartment means therein with openings thereto in two opposing surfaces, said contact element to be positioned between and to electrically interconnect conductive means on the surfaces of electrical components, comprising:
   a generally U-shaped spring, stamped and formed from resilient conductive material and having diverging cantilever spring arms extending obliquely outwardly from opposing edges of center support means; and a conductive member comprising a trace of conductive material extending for edge to edge across a flexible substrate of a suitable dielectric material forming a laminate, the edges of said laminate being attached to respective free ends of said spring arms and extending across the space between said cantilever spring arms with opposite ends of said trace being located adjacent respective ones of said openings to electrically engage and interconnect said conductive means on said electrical components when said spring member and conductive member are disposed in the compartment means.

18. The contact element of claim 17 further including a plurality of spring members connected together side by side by first strap means thereby forming a continuous strip and a plurality of conductive members connected together side by side by second strap means thereby forming a continuous strip.

19. The contact elements of claim 18 further including ground plane means attached to one of said spring members and electrically attached to said conductive trace on one of said spring members.

* * * * *